United States Patent
Karpman

(10) Patent No.: US 9,941,223 B2
(45) Date of Patent: Apr. 10, 2018

(54) DEVICES AND METHODS FOR DETECTING COUNTERFEIT SEMICONDUCTOR DEVICES

(71) Applicant: The Charles Stark Draper Laboratory, Inc., Cambridge, MA (US)

(72) Inventor: Maurice S. Karpman, Brookline, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 81 days.

(21) Appl. No.: 14/821,160

(22) Filed: Aug. 7, 2015

(65) Prior Publication Data
US 2016/0043043 A1    Feb. 11, 2016

Related U.S. Application Data

(60) Provisional application No. 62/035,136, filed on Aug. 8, 2014.

(51) Int. Cl.
| | |
|---|---|
| *G01B 7/16* | (2006.01) |
| *H01L 23/00* | (2006.01) |
| *G01L 1/18* | (2006.01) |
| *G01L 1/06* | (2006.01) |

(52) U.S. Cl.
CPC ............ *H01L 23/576* (2013.01); *G01L 1/06* (2013.01); *G01L 1/18* (2013.01); *H01L 2924/0002* (2013.01)

(58) Field of Classification Search
CPC . H01L 23/576; H01L 2924/0002; G01L 1/06; G01L 1/18

USPC ............................................ 73/760, 777, 769
See application file for complete search history.

(56) References Cited

U.S. PATENT DOCUMENTS

| | | | | |
|---|---|---|---|---|
| 6,427,539 | B1* | 8/2002 | Chen | G01L 9/0064 73/726 |
| 7,290,453 | B2* | 11/2007 | Brosh | G01L 9/0052 73/720 |
| 7,568,396 | B2* | 8/2009 | He | G01L 1/2293 73/777 |
| 8,181,021 | B2* | 5/2012 | Ginter | G06F 21/10 713/164 |
| 8,994,528 | B2* | 3/2015 | Celik-Butler | G01D 11/245 340/539.22 |
| 2006/0044138 | A1* | 3/2006 | Sin | G06F 21/87 340/568.2 |

(Continued)

OTHER PUBLICATIONS

Suhling, et al, Silicon Piezoresistive Stress Sensors and Their Application in Electronic Packaging, IEEE Sensors Journal, Jun. 2001, pp. 14-30, vol. 1, No. 1.

*Primary Examiner* — Max Noori
(74) *Attorney, Agent, or Firm* — Nutter McClennen & Fish LLP; John J. Penny, Jr.

(57) ABSTRACT

Techniques for providing a tamper mechanism for semiconductor devices are disclosed herein. The techniques include, for example, providing at least one die and at least one strain gauge, orienting the at least one strain gauge to the die, forming an encapsulated semiconductor device by encapsulating the die and each strain gauge within a mold compound to maintain respective orientation, and measuring an initial strain value for the at least one strain gauge after forming the encapsulated semiconductor device.

14 Claims, 2 Drawing Sheets

(56) References Cited

U.S. PATENT DOCUMENTS

| | | | |
|---|---|---|---|
| 2009/0114030 A1* | 5/2009 | Irving | G01L 1/2262 73/726 |
| 2010/0236334 A1* | 9/2010 | Koschmieder | G01N 19/08 73/799 |
| 2012/0193734 A1* | 8/2012 | Farahani | G01B 7/18 257/415 |

* cited by examiner

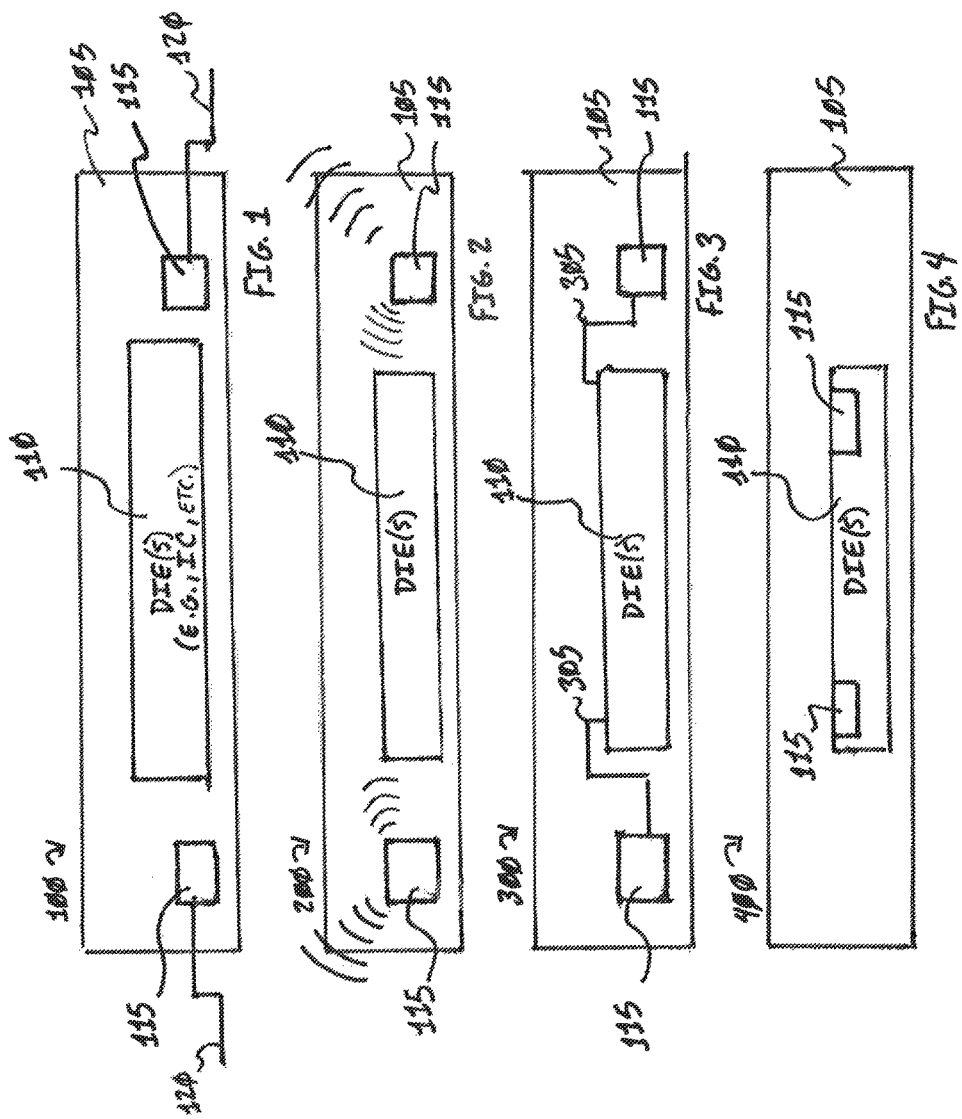

START [505]

PROVIDE AT LEAST ONE DIE [510]

ORIENT AT LEAST ONE STRAIN GAUGE (E.G., A SILICON BASED STRAIN GAGE, A PIEZORESISTIVE SILICON STRAIN GAGE, ETC.) ON THE SUBSTRATE (E.G., MOUNTING EACH STRAIN GAUGE TO AT LEAST A PORTION OF THE DIE, ETC.) [515]

OPTIONALLY, INTEGRALLY FORM EACH STRAIN GAGE WITH THE DIE [520]

FORM AN ENCAPSULATED SEMICONDUCTOR DEVICE BY ENCAPSULATING EACH DIE AND EACH STRAIN GAUGE WITHIN A MOLD COMPOUND [525]

MEASURE EACH STRAIN GAUGE AFTER FORMING THE ENCAPSULATED SEMICONDUCTOR DEVICE TO DETERMINE AN INITIAL STRAIN VALUE FOR EACH STRAIN GAUGE [530]

PROVIDE A MEMORY (E.G., NON-VOLATILE MEMORY, ETC.) IN COMMUNICATION WITH THE STRAIN GAGE (E.G., LOCAL MEMORY WITH RESPECT TO THE PACKAGE, EXTERNAL MEMORY WITH RESPECT TO THE PACKAGE, ETC.) [535]

COMMUNICATE (E.G., WIRELESSLY, ELECTRICALLY, ETC.), BY EACH STRAIN GAUGE, THE INITIAL STRAIN VALUE FOR EACH RESPECTIVE STRAIN GAUGE TO THE MEMORY TO CAUSE THE MEMORY TO STORE THE INITIAL STRAIN VALUE FOR EACH RESPECTIVE STRAIN GAUGE (E.G., COMMUNICATE TO THE DIE TO CAUSE THE DIE TO STORE THE STRAIN VALUE IN THE MEMORY, ETC.) [540]

OPTIONALLY, ADJUST THE STRAIN VALUE FOR EACH STRAIN GAUGE TO ACCOUNT FOR SHELF-TIME POST MANUFACTURING [545]

MEASURE A SUBSEQUENT STRAIN VALUE FOR EACH STRAIN GAUGE (E.G., AFTER SUBSEQUENT SALE OR RESALE OF ENCAPSULATED SEMICONDUCTOR DEVICE, ETC.) [550]

COMPARE THE SUBSEQUENT STRAIN VALUE TO THE INITIAL STRAIN VALUE CORRESPONDING TO EACH STRAIN GAUGE [555]

DETERMINE THE ENCAPSULATED SEMICONDUCTOR DEVICE IS COMPROMISED WHEN THE SUBSEQUENT STRAIN VALUE IS OUTSIDE A TOLERANCE OF THE INITIAL STRAIN VALUE FOR AT LEAST ONE CORRESPONDING STRAIN GAUGE [560]

END [565]

FIG. 5
REF. 500 ENTIRE FIG

DEVICES AND METHODS FOR DETECTING COUNTERFEIT SEMICONDUCTOR DEVICES

CROSS-REFERENCE TO RELATED APPLICATIONS

The present application is claiming priority to U.S. Provisional Patent Application Ser. No. 62/035,136, filed on Aug. 8, 2014, the content of which is herein incorporated by reference.

TECHNICAL FIELD

The present disclosure relates generally to electronic devices, and, more particularly, to techniques to detect counterfeit semiconductor devices.

BACKGROUND

Semiconductor devices, including encapsulated semiconductor devices, typically form part of larger electronic assemblies.

An illicit market exists to harvest or remove such encapsulated semiconductor devices from corresponding electronic assemblies for resale, and subsequent mounting to other electronic assemblies. Such harvesting can compromise the integrity of the encapsulated semiconductor device (e.g., life expectancy, performance characteristics, etc.) Moreover, the market has become increasingly sophisticated at removal techniques due to advancing technologies.

Despite efforts to date, a need remains for devices and techniques that detect post-manufacture counterfeiting of and/or tampering with encapsulated semiconductor devices.

SUMMARY

In accordance with one or more embodiments described herein, this disclosure provides techniques that provide tamper detecting mechanisms for encapsulated semiconductor devices and devices made using the same.

According to one or more embodiments of the disclosure, methods and techniques providing tamper detecting mechanisms include providing a die and at least one strain gauge, orienting the at least one strain gauge (e.g., an electrical resistance based strain gauge, a silicon based strain gauge, a piezoresistive silicon strain gauge, and the like) to the die. Optionally, at least a portion of the strain gauge can be mounted to the die. In certain other embodiments, the strain gauge and die can be integrally formed (e.g., using known additive or subtracting die forming techniques). The encapsulated semiconductor device is formed by encapsulating the die and the at least one strain gauge within a mold compound to maintain respective orientation. Once formed, an initial strain value (e.g., a resistive value) for the at least one strain gauge is measured. This initial strain measurement is preferably taken prior to the encapsulated semiconductor device exiting the manufacturer's control or supply chain to establish non-tampered baseline strain values, preferably (but not limited) to after all manufacturing strains/stresses occur to the encapsulated semiconductor device. The techniques, in certain embodiments, also provide a memory (e.g., non-volatile memory) in communication with the at least one strain gauge. The memory can include memory internal to the encapsulated semiconductor device (e.g., stand alone, integrated with the die, each strain gauge, combinations thereof, and the like). The initial strain measurement is preferably communicated (e.g., electrically, wirelessly, etc.) to the memory, which causes the memory to store the initial strain value. For example, the strain value can be communicated from the at least one strain gauge to the die to cause the die to store the strain value in the memory. Alternatively, in certain other embodiments, the strain value is communicated directly from the at least one strain gauge to the memory. In another embodiment, the strain value is recorded by the manufacturer and stored externally to the encapsulated semiconductor device. In this case, the manufacturer maintains traceability of the encapsulated semiconductor device (e.g. through serialization). Optionally, the strain value for the at least one strain gauge is adjusted to account for various post-manufacture times before sale or resale (e.g., shelf life prior to implementation).

Subsequent strain values for the at least one strain gauge are again measured. For example, the strain values for the at least one strain gauge are typically measured after initial sale or resale of the encapsulated semiconductor module, or after various shipment or relocation of the strain based module. In particular, the strain value is measured prior to the encapsulated semiconductor device's incorporation into an electronic assembly. The subsequent strain values are compared against the initial strain values to determine if the encapsulated semiconductor device is compromised. For example, if the subsequent strain value deviates from or is outside a particular tolerance of the initial strain value, the encapsulated semiconductor device is considered to be compromised (e.g., due to post-manufacture tampering).

Tamper detecting encapsulated semiconductor devices or devices made by one or more steps in the above discussed techniques are also disclosed herein.

It should be appreciated that the present technology can be implemented and utilized in numerous ways, including without limitation as a process, executable software instructions, an apparatus, a system, a device, a method for applications now known and later developed. These and other unique features of the technology disclosed herein will become more readily apparent from the following description and the accompanying drawings.

BRIEF DESCRIPTION OF THE DRAWINGS

The embodiments herein may be better understood by referring to the following description in conjunction with the accompanying drawings in which like reference numerals indicate identically or functionally similar elements, of which:

FIG. 1 illustrates a cross-sectional side elevation view of an encapsulated semiconductor device according to one or more embodiments disclosed herein;

FIG. 2 illustrates a cross-sectional side elevation view of an encapsulated semiconductor device, showing strain gauges having wireless communication capability;

FIG. 3 illustrates a cross-sectional side elevation view of an encapsulated semiconductor device, showing strain gauges physically coupled to a die;

FIG. 4 illustrates a cross-sectional side elevation view of an encapsulated semiconductor device showing strain gauges fabricated integrally to the die; and FIG. 5 illustrates an example simplified procedure for providing a tamper mechanism for encapsulated semiconductor devices.

DESCRIPTION OF EXEMPLARY EMBODIMENTS

As described herein, the present disclosure provides wafer based devices/modules and techniques that detect post-manufacture counterfeiting of and/or tampering with wafer based assemblies. In brief overview, one or more strain gauges are integrated during manufacture of encapsulated semiconductor devices to produce a device having a die and one or more strain gauges. Post manufacture, strain values are measured from each strain gauge. Subsequent purchasers of the encapsulated semiconductor devices measure subsequent strain values for each strain gauge, which subsequent strain value(s) are compared against the post manufacture strain value(s) to determine if the wafer based module is compromised. For example, post-manufacture tampering can be determined when the initial strain value deviate beyond a threshold tolerance of the subsequent strain value.

Referring now to FIGS. 1-4, various cross-sectional side elevation views of an encapsulated semiconductor device (e.g., an electronic package, a chip package, etc.) are illustrated according to one or more embodiments disclosed herein. Notably, each cross-sectional elevation side view shows an encapsulated semiconductor device 105, at least one die 110 and one or more strain gauges 115.

Referring particularly to FIG. 1, an encapsulated semiconductor device 100 is shown with two strain gauges 115 having electronic leads 120 extending therefrom. Leads 120 are formed, connected, or otherwise introduced during the encapsulated semiconductor device formation and connect to each strain gauge 115 to facilitate measuring strain values from each strain gauge 115. As shown, the leads include hardwiring from the strain gauge to an exterior of the wafer based module 100. As appreciated by those skilled in the art, such leads 120 are not limited to hardwiring, but can include various types of layering, etching, or other interconnections to facilitate measuring strain values of each strain gauge 115. Operatively, strain values for respective strain gauges are measured at each lead 120.

With respect to strain gauge(s) 115, preferably silicon based strain gauges are employed such as an electrically resistive strain gauge including silicon piezoresistive strain or stress gauges. As discussed above, unwanted tampering including post manufacture tampering with encapsulated semiconductor devices induce thermal strain/stress such as de-soldering as well as mechanical strain/stress such as physical removal of components. Such strains or stresses can be transmitted throughout the entire encapsulated semiconductor device and/or along specific axes (e.g., biaxial strain/stress, triaxial strain/stress, etc.). Such strains and stresses ultimately affect the performance of circuitry of the encapsulated semiconductor device and may result in reduced performance and/or premature failures.

Silicon based strain gauges are affected by these various strains and stresses. For example, the piezoresistive values for respective strain gauges changes when subjected to the various strains/stresses. Such changes in piezoresistive values can be measured close in time to post manufacturing to establish a baseline piezoresistive strain value as well as subsequently measured to determine the changes. Notably, the piezoresistive value for respective strain gauges can change depending on various conditions such as environmental conditions, including storage conditions, humidity, temperature, and the like, as well as temporal conditions, including an amount of time and expected degradation. Such variance can be accounted for as expected deviations from the initial baseline and tolerance values can be established that allow for these expected changes in the piezoresistive values. The use of multiple matched strain gauges (two or more) can provide a means for minimizing the impact of these common mode variations.

FIG. 2 illustrates an encapsulated semiconductor device 200 that includes strain gauges 115 having wireless communication technologies. Such technologies can include passive communication technologies (e.g., radio-frequency identification (RFID), etc.) or active communication technologies (e.g., known wireless protocols, near field communication (NFC), and the like). Die 110 of encapsulated semiconductor device 200 can also communicate with strain gauges 115 by the wireless communication technology. In this fashion, die 110 requests and receives strain values from each strain gauge 115 and, in certain embodiments, die 110 further stores respective values in onboard memory such as non-volatile based memory. Alternatively, strain gauge 115 communicates, by the wireless communication technology, outside encapsulated semiconductor device 200 to a corresponding strain measurement device to provide respective strain values.

FIG. 3 illustrates an encapsulated semiconductor device 300 that includes physical connections between strain gauges 115 and die 110. Like leads 120, physical connections 305 can be formed by various processes known to those skilled in the art. Importantly, die 110 and strain gauges 115 communicate by the physical connections 305 information including strain values for each strain gauge 115. As discussed above, in certain embodiment, die 110 stores such information in memory and/or transmits such information onward toward a requesting party. Additionally, physical connections 305, in certain embodiments, connect directly to pins on die 110.

FIG. 4 illustrates an encapsulated semiconductor device 400 that includes a die 110 having integrated strain gauges 115. As shown, during manufacture of die 110 strain gauges are integrally formed with die 110. For example, strain gauges 115 can be integrally formed with die 110 using various known etching and silicon deposition processes.

As discussed above, the techniques disclosed herein detect post-manufacture counterfeiting and/or tampering with encapsulated semiconductor devices. In particular, the techniques disclosed herein preferably use silicon piezoresistive stress/strain gauges (or sensors), which are typically introduced during manufacture processes as discussed herein.

With respect to the die, in the context of integrated circuits (ICs), the die preferably includes a semiconducting material, on which a given functional circuit is fabricated. Typically, ICs are produced on a wafer of electronic-grade silicon or other semiconductor (e.g., such as GaAs, etc.) through processes including photolithography. The wafer is cut into many pieces, each containing one copy of the circuit, with each piece being a respective die. Traditional manufacturing processes to produce encapsulated semiconductor devices include front-end-of-line processing and back-end-of-line processing and each of these types of processing include or exclude as appropriate steps including deposition transfer materials onto the wafer, removal, including for example, removing material from the wafer such as etching, patterning, including, for example, shaping/altering deposited materials such as lithography, and the like.

Referring to FIG. 5, a procedure or process 500 illustrates methods and techniques for detecting counterfeiting, which includes techniques for providing tamper mechanism for encapsulated semiconductor devices. Process 500 begins at 505 and continues to step 510 where a die is provided (e.g., mounted or oriented relative to a substrate, etc.). Next, in step 515, at least one strain gauge (e.g., a silicon based strain gauge, a piezoresistive silicon strain gauge, etc.), is oriented with the die. In certain embodiments, the strain gauge is mounted to at least a portion of the die. Optionally, in other embodiments (step 520), the strain gauge is formed integrally with the die.

The encapsulated semiconductor device is formed in step 525 by encapsulating the die and each strain gauge within a mold compound. Preferably, shortly after manufacture of the wafer based module (e.g., while still within the manufacturer's supply chain, etc.) strain values for each strain gauge are measured to determine initial strain values (e.g., a resistive value for silicon based or silicon piezoresistive strain gauges, etc.). In step 530, strain gauge values are measured for each strain gage after forming the encapsulated semiconductor device to determine initial strain values. In this manner, strain or stress induced during manufacturing processes (e.g., pre-encapsulation) are minimized.

A memory (e.g., non-volatile, etc.) in communication with the strain gauge is provided in step 535. As discussed above, the memory can include internal memory such as memory local to the die, local to the encapsulated semiconductor device, and the like. Alternatively, the memory can include external memory (e.g., from a separate module or device).

In step 540, the initial strain value for each strain gauge is communicated (e.g., electrically, wirelessly, etc.) to the memory to cause the memory to store the initial strain value. For example, the strain value can be communicated from each strain gauge to the die to cause the die to store the strain value in the memory. Alternatively, the strain value is communicated directly from each strain gauge to the memory. Optionally, in step 545, the strain value for each strain gauge is adjusted to account for various post-manufacture times before sale or re-sale. For example, there are industry known shelf-life degradation of mold compounds and corresponding strain values depending on the time and environmental conditions of the storage that can predictably change strain values.

The strain value for each strain gauge is again measured (e.g., subsequent to sale or resale of the wafer based module, etc.) in step 550, to determine a subsequent strain value. The subsequent strain value is compared, in step 555, to the initial strain value for each respective strain gauge to determine (step 560) if the encapsulated semiconductor device is compromised. For example, the subsequent strain value may deviate from or fall outside a tolerance of the initial strain value for any of the strain gauges.

Process 500 subsequently ends in step 565, but may begin again at step 510 where the die is provided. Notably, the encapsulated semiconductor device created by process 500 can be integrated or incorporated into various other package assemblies. The flow charts herein illustrate the structure or the logic of the present technology, possibly as embodied, in whole or in part, in computer program software for execution on a computer, digital processor, microprocessor or other electronic device. Those skilled in the art will appreciate that the flow charts illustrate the structures of the computer program code elements, including logic circuits on an integrated circuit that function according to the present technology. As such, the present technology may be practiced by a machine component that renders the program code elements in a form that instructs a digital processing apparatus to perform a sequence of function step(s) corresponding to those shown in the flow charts.

Further, it should be noted that certain steps within process 500 may be optional as described above, the steps shown in FIG. 5 are merely examples for illustration, and certain other steps may be included or excluded as desired. Further, while a particular order of the steps is shown, this ordering is merely illustrative, and any suitable arrangement of the steps may be utilized without departing from the scope of the embodiments herein.

The techniques described herein, therefore, provide for methods to detect strain and stress (e.g., from unwanted post-manufacture tampering) in encapsulated semiconductor devices. In particular, the techniques herein indicate tampering by comparing baseline or initial strain values (e.g., measured close to manufacture) and subsequent strain values (e.g., after the encapsulated semiconductor device is purchased/sold outside the manufacturer's supply chain). Deviation of the compared strain values outside acceptable tolerances indicates tampering with the encapsulated semiconductor device. Preferably, such techniques and resultant encapsulated semiconductor devices or devices are employed in electronic assemblies. While there have been shown and described illustrative embodiments that provide for detecting tampering in encapsulated semiconductor devices, it is to be understood that various other adaptations and modifications may be made within the spirit and scope of the embodiments herein. For example, the embodiments have been shown and described herein with relation to silicon based strain gauges. However, the embodiments in their broader sense are not as limited, and may, in fact, be used with other types of strain gauges. Further, the described illustrative embodiments have been shown with only one die in the encapsulated semiconductor device, however the embodiments in their broader sense are not as limited and may, in fact, be used with encapsulated semiconductor devices that incorporate more than one die or other passive or active component. Moreover, it is understood that the encapsulated semiconductor device provides some means for the die to receive power and receive or transmit information with external systems or devices.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method for providing a tamper mechanism for semiconductor devices, the method comprising:
    providing at least one die and at least one strain gauge;
    orienting the at least one strain gauge relative to the at least one die;
    forming an encapsulated semiconductor device by encapsulating the at least one die and the at least one strain gauge within a mold compound to maintain respective orientation of the die and each strain gauge;
    measuring an initial strain value of the at least one strain gauge after forming the encapsulated semiconductor device; and
    adjusting the strain value for each strain gauge to account for shelf-time post manufacturing.

2. The method of claim 1, further comprising:
storing the at least one initial strain value in a memory of the die.

3. The method of claim 2, further comprising:
storing a tolerance range for the at least one initial strain value in the memory of the die.

4. The method of claim 3, further comprising:
measuring a subsequent strain value for the at least one strain gauge; and
comparing the subsequent strain value to the initial strain value; and
determining the encapsulated semiconductor device is compromised when the subsequent strain value is outside the tolerance of the initial strain value.

5. The method of claim 1, further comprising:
wirelessly communicating, by each strain gauge, the initial strain value for each respective strain gauge to the die to cause the die to store the initial strain value for each respective strain gauge in a memory.

6. The method of claim 1, further comprising:
electrically communicating, by each strain gauge, the initial strain value for each respective strain gauge to the die to cause the die to store the initial strain value for each respective strain gauge in a memory.

7. The method of claim 1, further comprising:
providing a memory in communication with the at least one strain gauge;
communicating, by each strain gauge, the initial strain value for each respective strain gauge to the memory to cause the memory to store the initial strain value for each respective strain gauge.

8. The method of claim 1, wherein the step for orienting the at least one strain gauge on the substrate further comprises:
mounting each strain gauge to at least a portion of the die.

9. The method of claim 1, further comprising:
integrally forming the at least one strain gauge as part of the die.

10. The method of claim 1, wherein the at least one strain gauge comprises at least two strain gauges, the method further comprising:
minimizing common mode variation using strain values measured at each of the at least two strain gauges.

11. The method of claim 1, wherein the strain gauge is a silicon based strain gauge.

12. The method of claim 11, wherein the strain gauge is a piezoresistive silicon strain gauge.

13. The method of claim 1, wherein the at least one strain gauge comprises two strain gauges.

14. A semiconductor device that measures strain from tampering, the device comprising:
at least one die;
at least one strain gauge, the die and the strain gauge being encapsulated in a mold compound, the strain gauge for measuring strain induced on the mold compound
communication interfaces operatively coupled to the at least one strain gauge and configured to transmit a strain value for each strain gauge, wherein the strain value has a value that accounts for shelf-time post manufacturing; and
a memory operatively coupled to the communication interfaces and configured to store the strain value for each strain gauge, wherein the communication interfaces and the memory are operatively coupled to the die,
wherein the die is configured to receive the strain value for each strain gauge and cause the memory to store the strain value for each strain gauge, and
wherein the memory is further configured to store a process executable by the die, the process when executed by the die, causes the die to: store at least an initial strain value for each strain gauge; and store one or more tolerance values corresponding to the initial strain value.

* * * * *